(12) United States Patent
Ndip et al.

(10) Patent No.: US 10,978,778 B2
(45) Date of Patent: Apr. 13, 2021

(54) WAFER LEVEL PACKAGE WITH INTEGRATED ANTENNAS AND MEANS FOR SHIELDING

(71) Applicant: Fraunhofer-Gesellschaft zur Foerderung der angewandten Forschung e.V., Munich (DE)

(72) Inventors: Ivan Ndip, Berlin (DE); Tanja Braun, Berlin (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 307 days.

(21) Appl. No.: 15/860,926

(22) Filed: Jan. 3, 2018

(65) Prior Publication Data

US 2018/0191052 A1    Jul. 5, 2018

(30) Foreign Application Priority Data

Jan. 5, 2017  (DE) .......................... 102017200122.4

(51) Int. Cl.
| | |
|---|---|
| H01Q 1/22 | (2006.01) |
| H01L 23/538 | (2006.01) |
| H01L 23/00 | (2006.01) |
| H01L 23/66 | (2006.01) |
| H01L 23/552 | (2006.01) |

(52) U.S. Cl.
CPC ....... *H01Q 1/2283* (2013.01); *H01L 23/5389* (2013.01); *H01L 23/552* (2013.01); *H01L 23/66* (2013.01); *H01L 24/20* (2013.01); *H01L 24/96* (2013.01); *H01L 24/97* (2013.01); *H01L 2223/6677* (2013.01); *H01L 2224/04105* (2013.01); *H01L 2224/12105* (2013.01); *H01L 2224/16225* (2013.01); *H01L 2224/2518* (2013.01); *H01L 2224/73259* (2013.01);
(Continued)

(58) Field of Classification Search
CPC ................................................... H01Q 1/2283
See application file for complete search history.

(56) References Cited

U.S. PATENT DOCUMENTS

| | | |
|---|---|---|
| 6,770,955 B1 | 8/2004 | Coccioli et al. |
| 7,848,108 B1 | 12/2010 | Archambeault et al. |

(Continued)

FOREIGN PATENT DOCUMENTS

| | | |
|---|---|---|
| DE | 102006023123 A1 | 1/2007 |
| DE | 102010001407 A1 | 9/2010 |

(Continued)

OTHER PUBLICATIONS

Beck, C., et al., "Industrial mmWave Radar Sensor in Embedded Wafer-Level BGA Packaging Technology", IEEE Sensors Journal, vol. 16, No. 17, Sep. 1, 2016, pp. 6566-6578.

(Continued)

*Primary Examiner* — Graham P Smith
(74) *Attorney, Agent, or Firm* — Michael A. Glenn; Perkins Coie LLP

(57) ABSTRACT

A wafer level package with integrated antenna includes a contacting layer, an antenna layer with integrated antenna as well as a chip layer having at least one chip arranged between the contacting layer and the antenna layer. Further, means for shielding are implemented between the antenna layer and the chip layer.

14 Claims, 9 Drawing Sheets

(52) U.S. Cl.
CPC ............... *H01L 2924/1421* (2013.01); *H01L 2924/18162* (2013.01); *H01L 2924/3025* (2013.01)

(56) References Cited

U.S. PATENT DOCUMENTS

| | | |
|---|---|---|
| 2004/0041262 A1 | 3/2004 | Okamoto et al. |
| 2005/0098348 A1 | 5/2005 | Okumichi et al. |
| 2005/0151698 A1 | 7/2005 | Mohamadi |
| 2007/0026567 A1 | 2/2007 | Beer et al. |
| 2007/0200748 A1 | 8/2007 | Hoegerl et al. |
| 2008/0029886 A1 | 2/2008 | Cotte et al. |
| 2008/0186247 A1 | 8/2008 | Cotte et al. |
| 2008/0231518 A1 | 9/2008 | Tsutsumi et al. |
| 2010/0164808 A1 | 7/2010 | Chang et al. |
| 2010/0193935 A1 | 8/2010 | Lachner et al. |
| 2011/0279190 A1 | 11/2011 | Liu et al. |
| 2012/0062439 A1* | 3/2012 | Liao ............ H01Q 1/526 343/841 |
| 2012/0104574 A1 | 5/2012 | Boeck et al. |
| 2012/0313253 A1 | 12/2012 | Nakadaira et al. |
| 2013/0037950 A1 | 2/2013 | Yu et al. |
| 2013/0292808 A1 | 11/2013 | Yen et al. |
| 2014/0035154 A1 | 2/2014 | Geitner et al. |
| 2014/0168014 A1 | 6/2014 | Chih et al. |
| 2014/0293529 A1 | 10/2014 | Nair et al. |
| 2015/0194388 A1 | 7/2015 | Pabst et al. |
| 2015/0207236 A1 | 7/2015 | Felic et al. |
| 2015/0380386 A1 | 12/2015 | Vincent et al. |
| 2016/0190038 A1 | 6/2016 | Koyama et al. |
| 2016/0233178 A1 | 8/2016 | Lamy et al. |
| 2016/0240492 A1 | 8/2016 | Wolter et al. |
| 2016/0329299 A1 | 11/2016 | Lin et al. |
| 2017/0236776 A1 | 8/2017 | Huynh et al. |
| 2017/0345761 A1 | 11/2017 | Yu et al. |

FOREIGN PATENT DOCUMENTS

| | | |
|---|---|---|
| DE | 102013108075 A1 | 2/2014 |
| EP | 3065220 A1 | 9/2016 |
| GB | 2216320 A | 10/1989 |
| JP | 2008505557 A | 2/2008 |
| JP | 2011521498 A | 7/2011 |

OTHER PUBLICATIONS

Keser, B., et al., "The Redistributed Chip Package: A Breakthrough for Advance Packaging", Proceedings of ECTC 2007, Reno/Nevada, USA, 2007, pp. 286-291.

Meyer, T., et al., "Embedded Wafer Level Ball Grid Array (eWLB)", Proceedings of EPTC 2008, pp. 994-998.

Pourmousavi, M., et al., "The Impact of Embedded Wafer Level BGA Package on the Antenna performance", 2013 EEE-APS Topical Conference on Antennas and Propagation in Wireless Communications (APWC), 2013, pp. 828-831.

Tsai, C. H., et al., "Array Antenna Integrated Fan-Out Wafer Level Packaing (InFO-WLP) for Millimeter Wave System Applicatioans", 2013 IEEE International Electronic Devices Meeting (IEDM), Dec. 9-11, 2013, pp. 25.1.1-25.1.4.

* cited by examiner

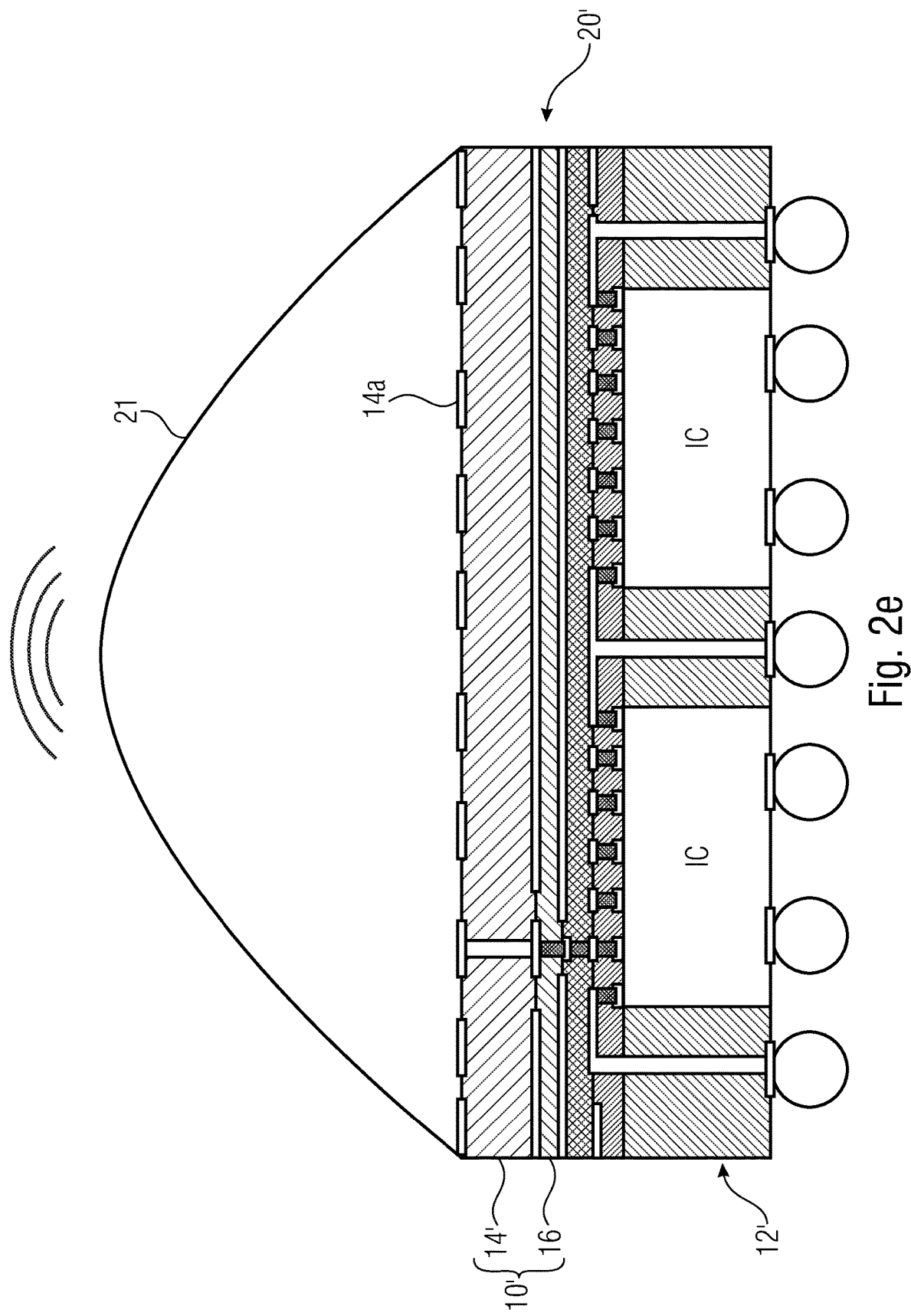

WAFER LEVEL PACKAGE WITH INTEGRATED ANTENNAS AND MEANS FOR SHIELDING

CROSS-REFERENCE TO RELATED APPLICATIONS

This application claims priority from German Patent Application No. 10 2017 200 122.4, which was filed on Jan. 5, 2017, which is incorporated herein in its entirety by this reference thereto.

Embodiments of the present invention relate to a wafer level package with integrated antenna as well as to a respective manufacturing method. Preferred embodiments relate to a miniaturized fan-out panel/wafer level-based system integration platform with integrated antenna.

Embodiments of the present invention relate to a wafer level package with at least one integrated antenna element as well as to a respective manufacturing method. Preferred embodiments relate to a fan-out panel/wafer level-based system integration platform with superstrate integrated antennas without redistribution plane.

BACKGROUND OF THE INVENTION

The antennas in eWLB and InFO cannot be optimized without adapting the dimensions of the RDL and the mold material, which limits the freedom of design of the platform.

Both in eWLB and in InFO, the fields of the integrated antennas are not shielded from the chips and other integrated components. The undesired interaction can result in EMC problems.

In eWLB, the radiation of an integrated antenna cannot cover the entire hemisphere (the entire horizontal and vertical plane) without causing undesired coupling with other integrated components. The reason for that is that other components are integrated on the same plane as the antennas. Thus, there is the need for an improved approach.

SUMMARY

According to an embodiment, a wafer level package with integrated antenna may have: a contacting layer; an antenna layer with the integrated antenna; and a chip layer including at least one chip arranged between the contacting layer and the antenna layer, wherein means for shielding are implemented between the antenna layer and the chip layer.

Another embodiment may have a system including the inventive wafer level package, wherein a further wafer level package is connected to the wafer level package via the contacting layer.

According to another embodiment, a method of manufacturing a wafer level package with integrated antenna may have the steps of: arranging a contacting layer; arranging a chip layer including at least one chip on the contacting layer; arranging means for shielding on the chip layer; and arranging an antenna layer on the means for shielding.

Embodiments of the present invention provide a wafer level package with integrated antenna. The wafer level package comprises a contacting layer, an antenna layer with integrated antenna as well as a chip layer arranged between the contacting layer and the antenna layer including at least one chip. Means for shielding, such as a shielding plane or generally a shield are provided between the antenna layer and the chip layer. According to embodiments, also, a redistribution layer can be implemented between the means for shielding and the chip layer.

Embodiments of the present invention are based on the knowledge that it is advantageous in a layered structure of antenna part and chip part when shielding is provided between these two layers, which protects both the chips/ICs of the chip layer from the radiation of the antenna and vice versa shields the antenna from EMC influences of the chips. The arrangement of the redistribution plane on the side of the shield facing away from the antenna is advantageous since in that way mutual interferences can be prevented by the shield. Additionally, it should be mentioned that decoupling of chip layer and antenna layer allows enables a relatively flexible design of both planes, since now hardly any or only few interactions have to be considered.

According to embodiments, the chip plane is formed by one or several chips in combination with a mold material. When it is assumed that the redistribution plane is on the side of the side facing the antenna, according to embodiments, connection between the redistribution plane and the contacting plane can be established, for example by vias. Alternatively or additionally, it would also be possible that chips are contacted on both sides, i.e., via the redistribution plane and via the contacting plane. Instead of contacting the chips on the side of the contacting plane via this plane, also, means for temperature dissipation for the chip can be provided. In that way, there is not only the advantageous possibility of designing both chip plane and antenna layer in a flexible manner, but also a maximum degree of freedom and the provision of further elements, such as the cooling elements, respectively, is enabled for the contacting plane.

According to the following embodiments, a dielectric can be provided between the antenna layer and the means for shielding. According to additional embodiments, this dielectric can also be perforated in order to allow filter functionality. In this concept, it is advantageous that both the material and the thickness of the dielectricity layer can be varied without influencing the other layers. Here, it should also be noted that, according to embodiments, the antenna plane can also include a plurality of antenna elements. Analogously to the dielectric, an isolation layer can be provided between the chip plane and the above discussed redistribution plane. According to again further embodiments, contacting is established, for example, by means of a via projecting through the means for shielding and possibly existing further layers (dielectricity layer and isolation layer). Thus, this via connects the chip, such as the RF chip of the chip plane to one or several antenna elements. Alternatively, according to further embodiments, the one or several antennas can be contacted by means of electromagnetic coupling.

Further embodiments provide a method of manufacturing a wafer level package with integrated antenna. In this method, first, the contacting layer is manufactured together with a chip layer before the antenna layer is arranged on the chip layer with means for shielding arranged in between. The antenna layer can be deposited, for example, by means of laminating, planar adhesion or via a glass substrate.

BRIEF DESCRIPTION OF THE DRAWINGS

Embodiments of the present invention will be detailed subsequently referring to the appended drawings, in which:

FIG. 2e is a schematic sectional view of a wafer level package with lens according to an embodiment;

DETAILED DESCRIPTION OF THE INVENTION

Before embodiments of the present invention will be discussed in more detail below based on the accompanying drawings, it should be noted that functionally equal elements and structures are provided with the same reference numbers such that the description of the same are inter-applicable and inter-exchangeable.

Figure 1:
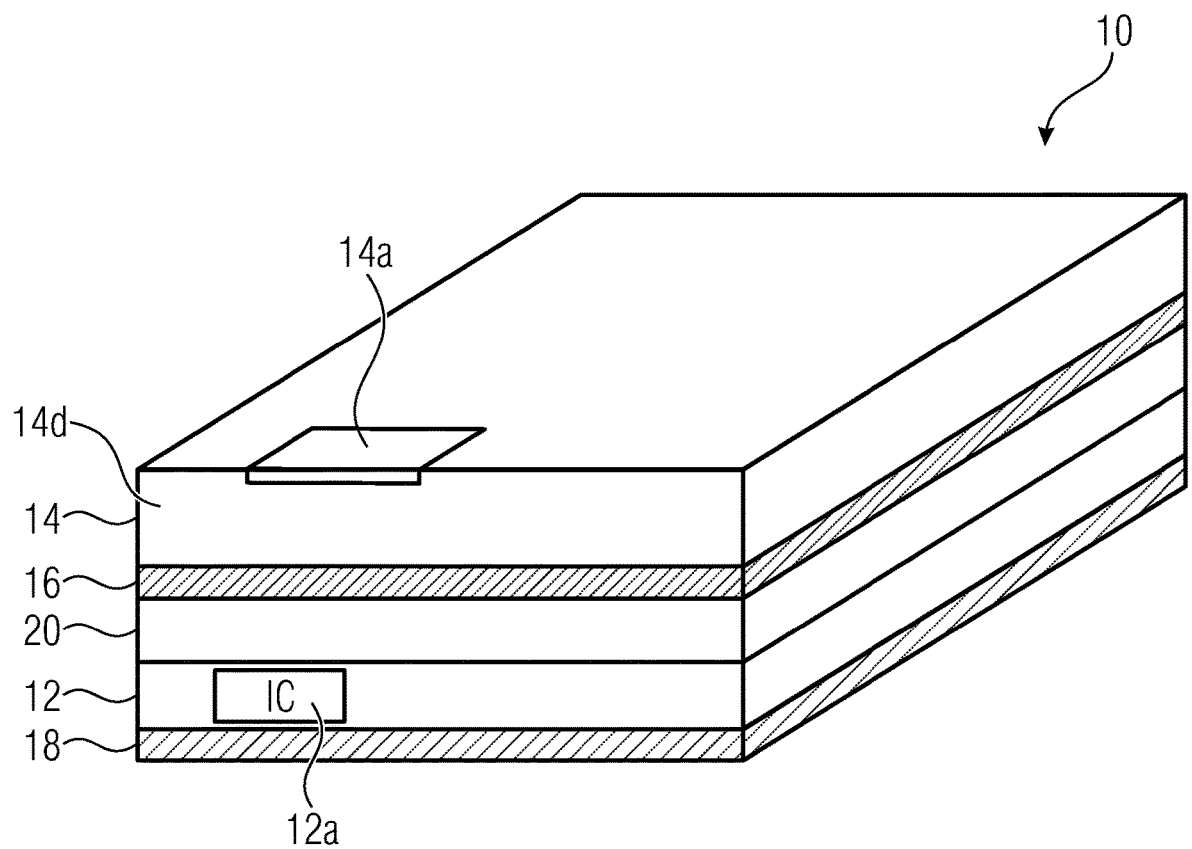
FIG. 1 is a schematic illustration of a wafer level package with integrated antenna according to a basic embodiment.

FIG. 1 shows a wafer level package 10 with a chip layer 12, an antenna layer 14 as well as means for shielding (cf. reference number 16) that are arranged between the chip layer 12 and the antenna layer 14. Additionally, the wafer level package 10 comprises a contacting layer 18 which is arranged on the bottom side of the chip layer 12, i.e., on the side of the chip layer 12 opposite to the antenna layer 14.

The antenna layer 14 includes at least one integrated antenna or an antenna array, here the integrated antenna 14a and advantageously, but not necessarily a dielectric area 14d which is normally arranged between the antenna 14a and the layer 16 with means for shielding.

In this embodiment, the means for shielding are formed by a shielding layer 16, i.e., for example, by a metallization plane.

The chip layer 12 includes one or several chips, here the chip 12a (such as a RF chip) which is embedded in the layer 12. Embedding can be performed, for example, by means of a fan-out panel/wafer level process with the help of polymer, such as a mold material. According to embodiments, a further layer 20 can be provided between the shielding layer 16 and the chip layer 12, which includes, e.g., a redistribution plane and/or isolation layers.

The chip 12a is connected, for example, via this redistribution plane in the layer and/or via the contacting layer 18. According to embodiments, the redistribution plane of the layer 20 can be connected to the contacting layer 18, e.g., by means of vias. According to further embodiments, a via can also extend from the chip 12a to the integrated antenna 14a in order to contact the same.

The structure described herein offers advantages with respect to complete integration of the antennas 14a, chips 12a, passive components and other system components into the fan-out panel/wafer level-based system integration platform and module 10, respectively. Thereby, the functionality of the platform and the module 10, respectively, is completely independent from the printed circuit board. In other state of the art FO-WLP, such as eWLB, this is not the case. Here, the reflector of the antennas is integrated on the printed circuit board. Thereby, the functionality of the antennas and also of the platform and the module, respectively, depends on the dimensions of the BGA balls, the process variations and also on the printed circuit board.

Since optionally a separate substrate 14 is used for integrated antennas 14a, these antennas 14a can be optimized without changing the residual structure of the platform and the module 10, respectively. In other FO-WLP modules, this is not the case, for optimizing antennas 14a in eWLB and InFO, for example, the dimensions of the RDL mode material have to be adapted.

The fields of the integrated antennas 14a are completely shielded from the chips 12a, passive and other components that are integrated in the fan-out panel/wafer level-based system integration platform and module, respectively. Thereby, EMC problems are prevented. In other fan-out modules, this is not the case. Neither in InFo-WLP nor in eWLB are the antennas 14a shielded from the chips 12a.

With reference to FIGS. 2a-2f, extended embodiments will be explained.

Figure 2A:
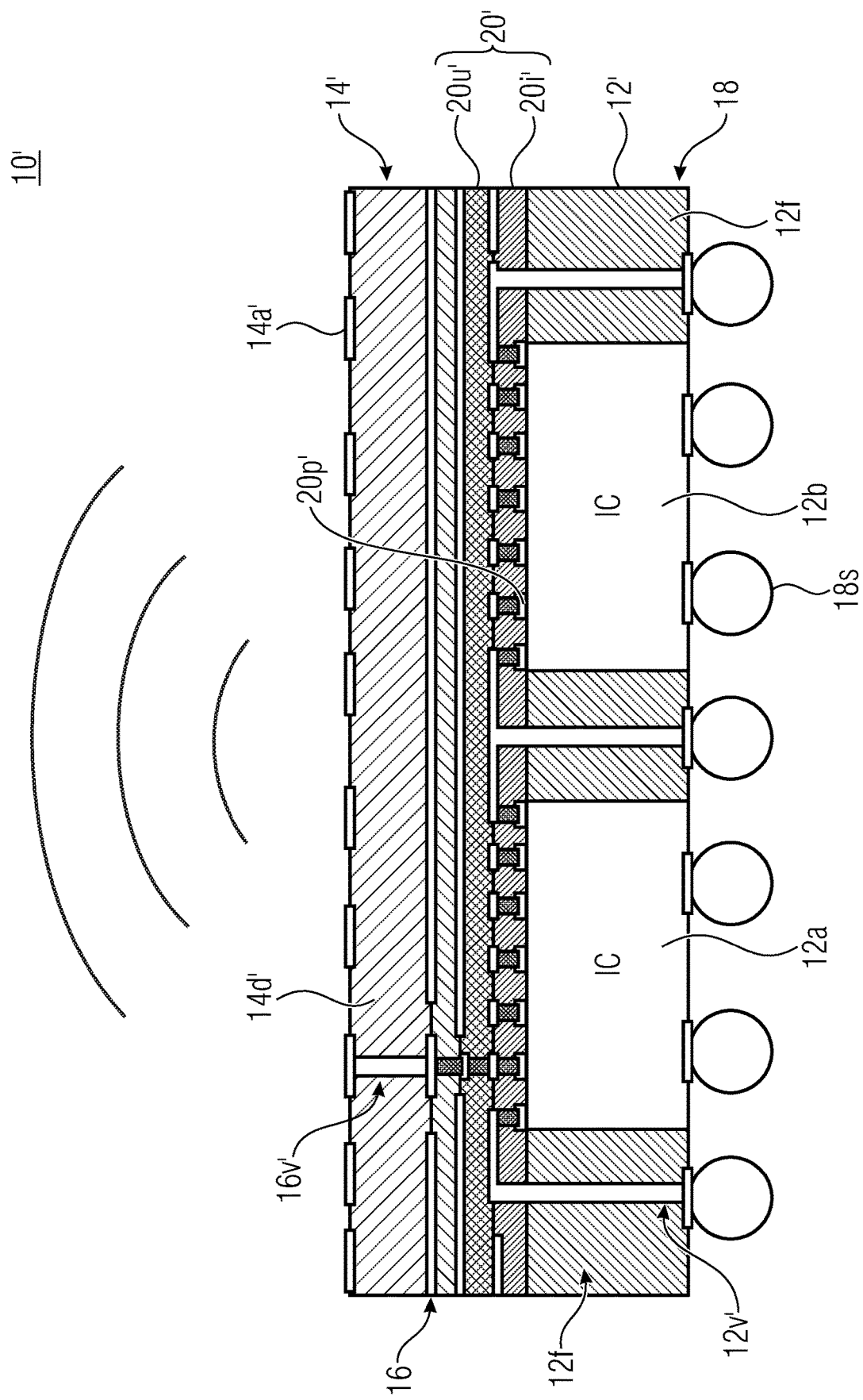
FIG. 2a-2d are schematic sectional views of wafer level packages with integrated antenna according to extended embodiments.

FIG. 2a shows a wafer level package 10' with the chip layer 12', the antenna layer 14', wherein the shielding layers 16 as well as the redistribution plane 20', respectively, are provided between the chip layer 12' and the antenna layer 14'. Additionally, the contacting plane 18 is arranged on the bottom side of the chip layer 12'.

The chip layer 12' includes the two chips 12a and 12b that are integrated in a so-called fan-out area 12f including other ICs, passive or other systems components. This fan-out area 12f is typically formed by a polymer and mold material, respectively.

The antenna 14a' extends across the entire antenna layer 16 and here in particular across the surface of the same. The antenna layer 14 is, for example, formed by a glass substrate, a polymer, a laminate etc., which forms the respective dielectric 14' for the antenna 14a. As can be seen, the individual antenna areas and antenna planes are completely embedded into the dielectric 14d'.

For contacting the antenna 14a', the antenna 14a is connected to the chip 12a', here a RF chip by means of a vertical via. As the illustration shows, via 16f' represents the shortest connection. This short signal path with few discontinuities allows the signal integrity, also for millimeter waves and terahertz signals. Alternatively, also, electromagnetic coupling, e.g., via aperture coupling or near field coupling can be realized to the vertical probe 16f'. Further, it would also be possible that in addition to the vertical vias 16f' a planar connector, such as a transmission line is used.

The layer 20' includes the redistribution plane 20u', e.g., for signal distribution and current supply as well as the isolator 20i' arranged between the chip plane 12' and the redistribution plane 20'. According to further embodiments, the redistribution plane 20' consists of one or several metal and dielectric isolation layers. Additionally, passive components, such as inductances, resistors, capacitors, filters or other elements can be integrated in the redistribution plane 20' and in particular in the metallization plane 20u'. Alternatively, embedding these passive elements into the mold material of the chip plane 12' would be possible, wherein then these passive elements are contacted via the redistribution plane 12u'.

On the front, the ICs 12a and 12b are connected to the redistribution plane 20u' via pads 20p'. Further, the redistribution plane 20u' contacts the contacting layer 18 by means of vias 12v' that project through the mold material 12f and generally through the chip plane 12'. By means of the electrically conductive via 12v' through the embedded polymer (mold compound) 12f, the redistribution layers 20u' including the antenna layer 14a' can be routed to the package rear side 18 for contacting the substrate. This contacting layer 18 includes, for example, solder balls and thermal balls, respectively, via which the entire package 10' is contacted. In this embodiment, it is also the case that the solder balls 18s and the contacting elements of the contacting layer 18, respectively, are provided on the bottom side of the ICs 12a and 12b, such that the ICs 12a and 12b can be contacted on both sides.

The antenna substrate 16+14' consisting of at least two metal layers 16 and 14a' (means for shielding and antenna) as well as one dielectric layer 14d' arranged there between lies above the redistribution plane 20u'. As already mentioned above, the metal layer 16 serves to shield the antenna fields from the integrated components. The antenna 14a' can be built of either of one or several radiating elements (antenna array) and, as mentioned above, the same is excited either galvanically with the help of a conductor or a via (probe feed) or electromagnetic coupling (e.g., aperture coupled, proximity feed). Depending on the desired radiation characteristic, the antenna substrate 16+14' allows the realization of different antenna configurations, e.g., patch, grid array, slit, substrate integrated wave guide (SIW) based antennas, dipole, monopole, Yagi-Uda, Vivaldi, etc. According to further embodiments, the integrated antennas can also be configured in an "intelligent" manner, i.e., reconfigurable, controllable, adaptive and smart, respectively. The electronics (e.g., circuits and/or diodes) usually necessitated for re-configurability can either be integrated in the antenna substrate 16+14', in the redistribution plane 20', the polymer substrate 12' (i.e., together with the ICs 12a and 12b). Here, according to further embodiments, it would also be possible that the electronics for controlling the antenna (e.g., phase shifter) is arranged either in the redistribution plane 20' or in the chip plane 12', respectively.

Starting from the structure of the wafer level package 10' presented herein, the antenna can radiate out of the surface plane, can radiate to the side (azimuth plane) or in both directions, depending on the antenna configuration. As illustrated, in the embodiment presented herein, radiation is performed in particular out of the main surface of the antenna 14a'.

The platform and the module 10', respectively, allows the radiation of the integrated antennas 16a' into the entire hemisphere (i.e., in the entire azimuthal and vertical plane) without causing undesired coupling with other integrated components. This is possible because no other components are integrated on the antenna plane 14'. With eWLB, e.g., this is not the case, since the ICs 12a, 12b and other components are integrated on the same plane as the antennas 14a'. When it has been assumed in the above embodiments 10 and 10' that radiation of the antenna 14a' takes place only out of the main surface, such as illustrated in FIG. 2d, radiation can also take place to the side. Here, it should be noted that the wafer level package of FIG. 2d is provided with reference number 10''' and will be discussed in detail with reference to FIG. 2d.

Figure 2B:
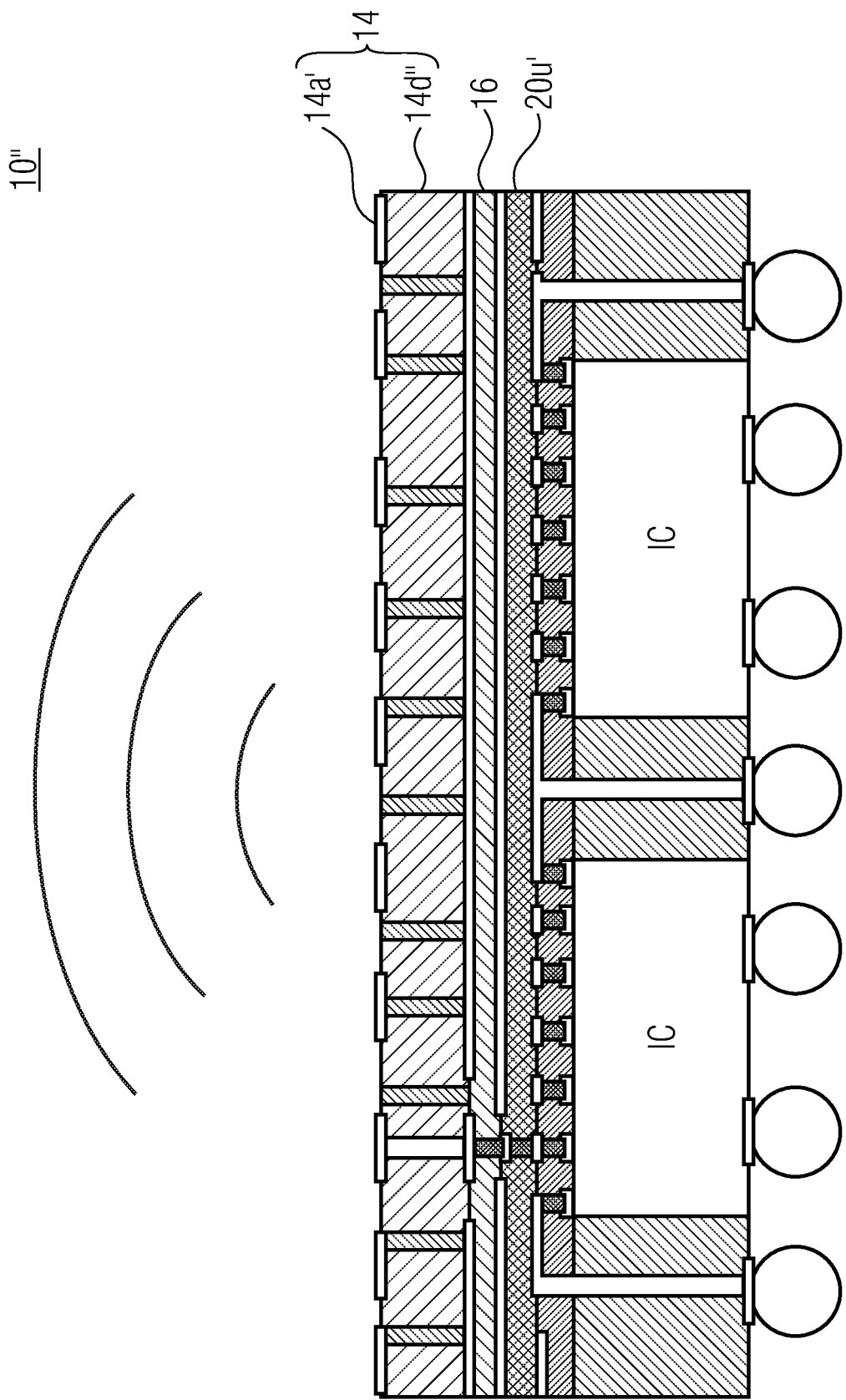

FIG. 2b shows a modified embodiment of the wafer level package 10', namely the wafer level package 10''. This differs from the wafer level package 10' with respect to the antenna substrate in the antenna layer 14''. The antenna substrate includes the elements antenna 14a', dielectric 14d'' as well as means for shielding 16. As already discussed above, the antenna substrate and in particular the dielectric 14d'' can include a polymer material, a glass material, a RF laminate or another suitable RF material. In this embodiment, the dielectric layer 14d'' is provided with periodic holes, i.e., the same is perforated. Thereby, the substrate 14+16 behaves like a photonic band gap structure resulting in filtering the surface waves and hence improving the radiation characteristic. Further, the value of the effective primitivity of the substrate is decreased due to the holes. Thereby, the edge length of the antenna structure is increased at higher frequencies and the influence of process variations becomes lower. The radiation characteristic of the antenna 16a' can also be improved by integrating electromagnetic band gap structures (EBG) either in the antenna substrate 14''+16 or the redistribution plane 20u'.

Figure 2C:
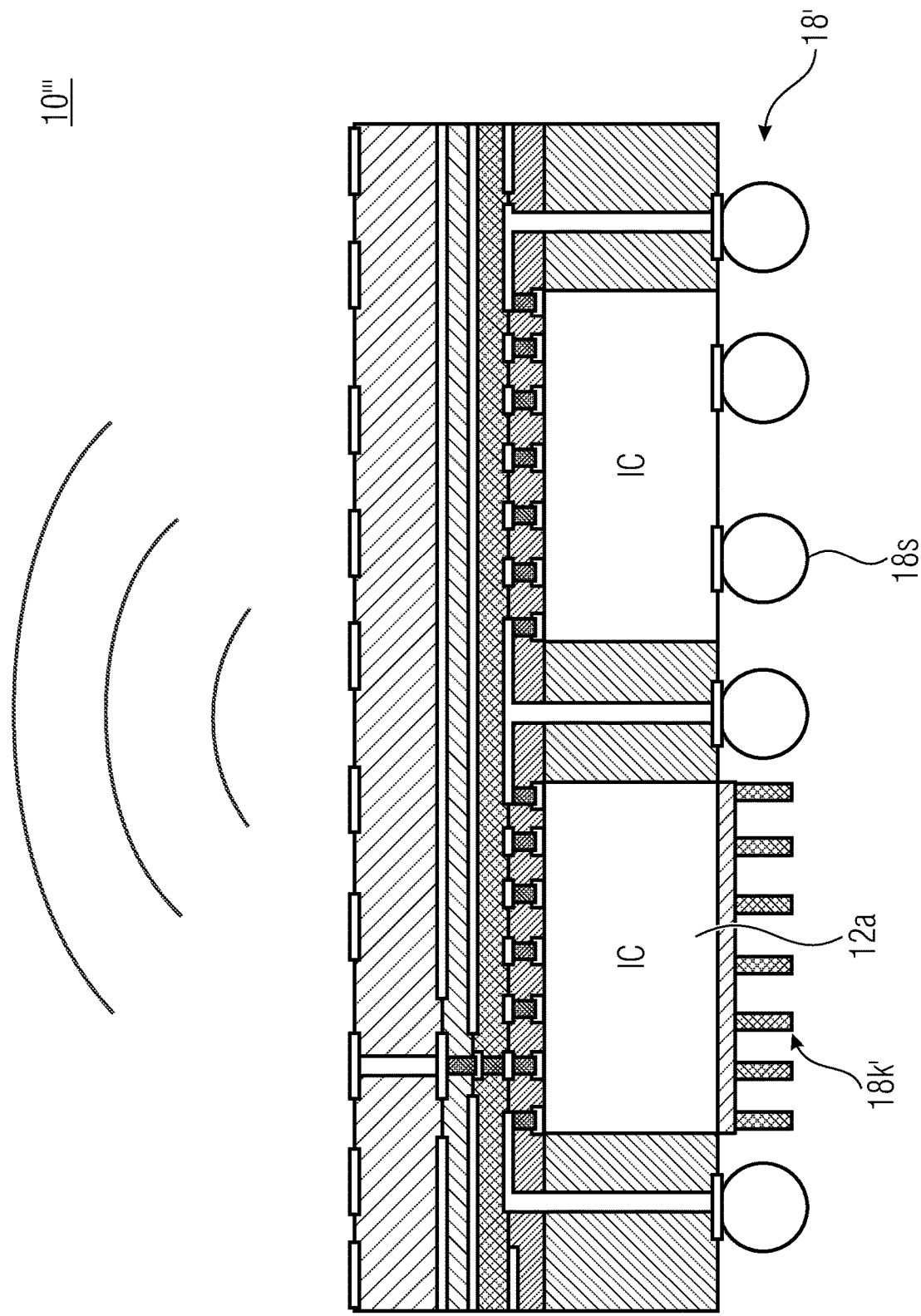
Figure 2D:
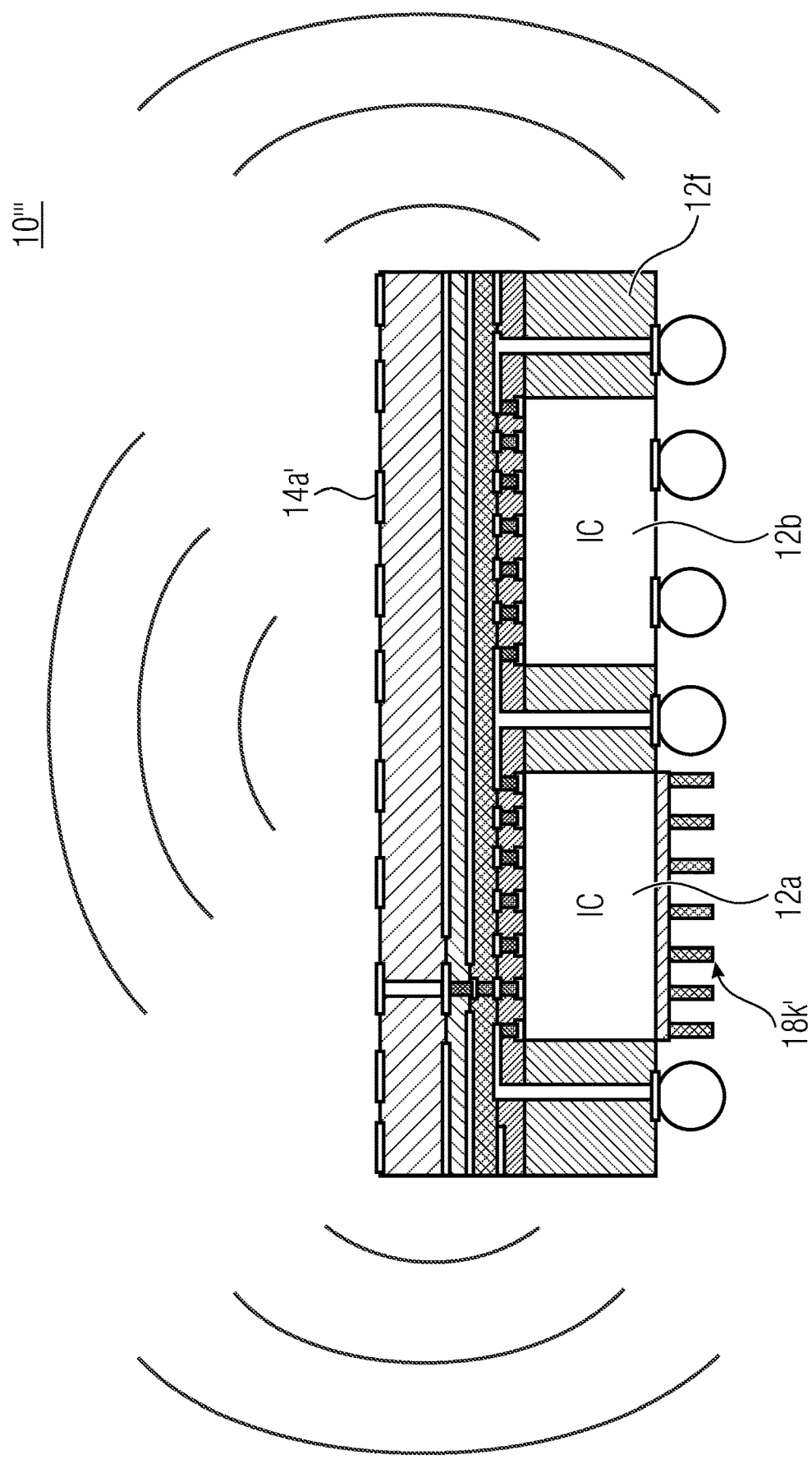
Figure 2F:
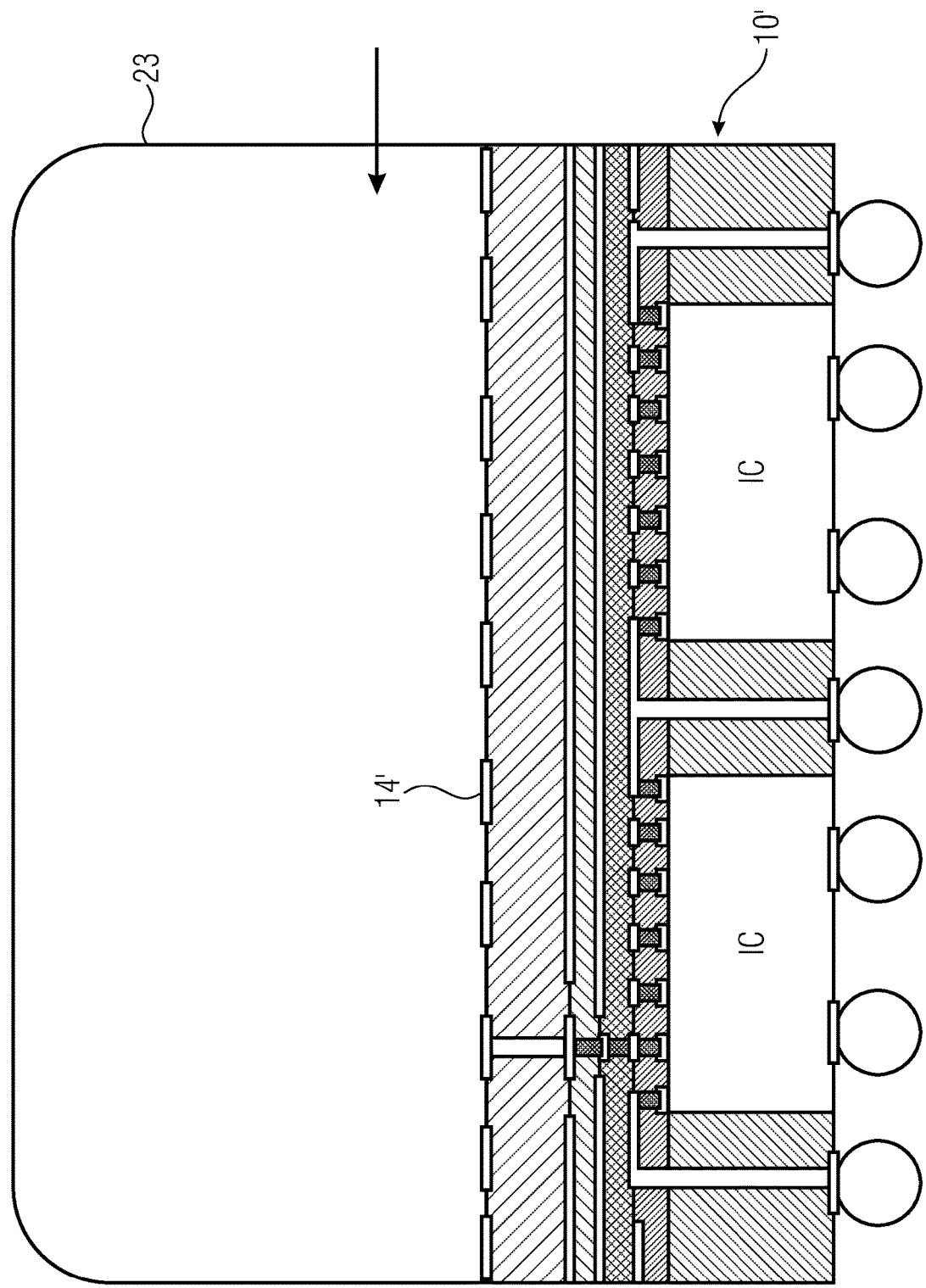
FIG. 2f is a schematic sectional view of a wafer level package with housing according to an embodiment.
Figure 3A:
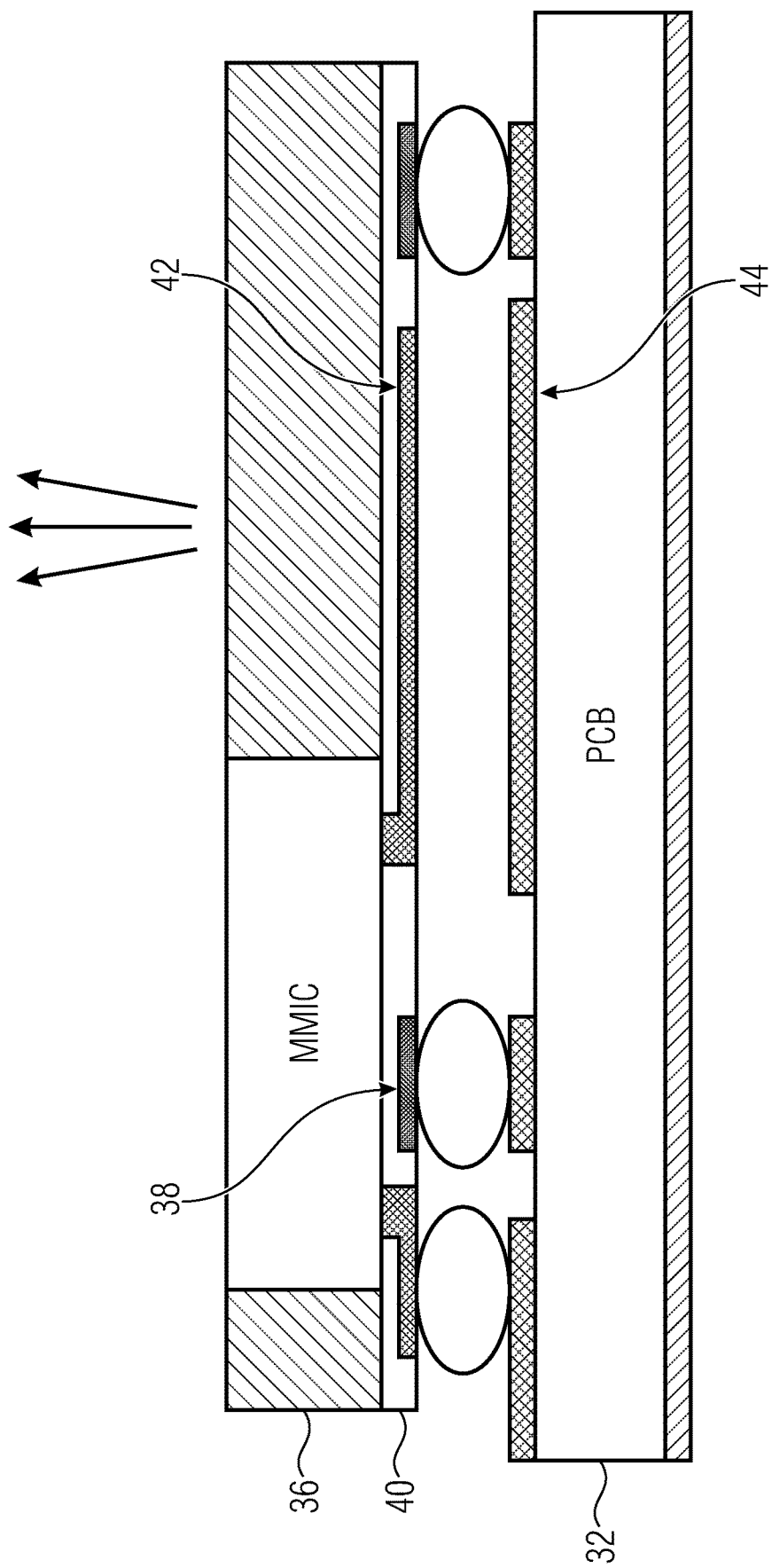
FIGS. 3a and 3b are schematic illustrations of wafer level packages according to conventional approaches.
Figure 3B:
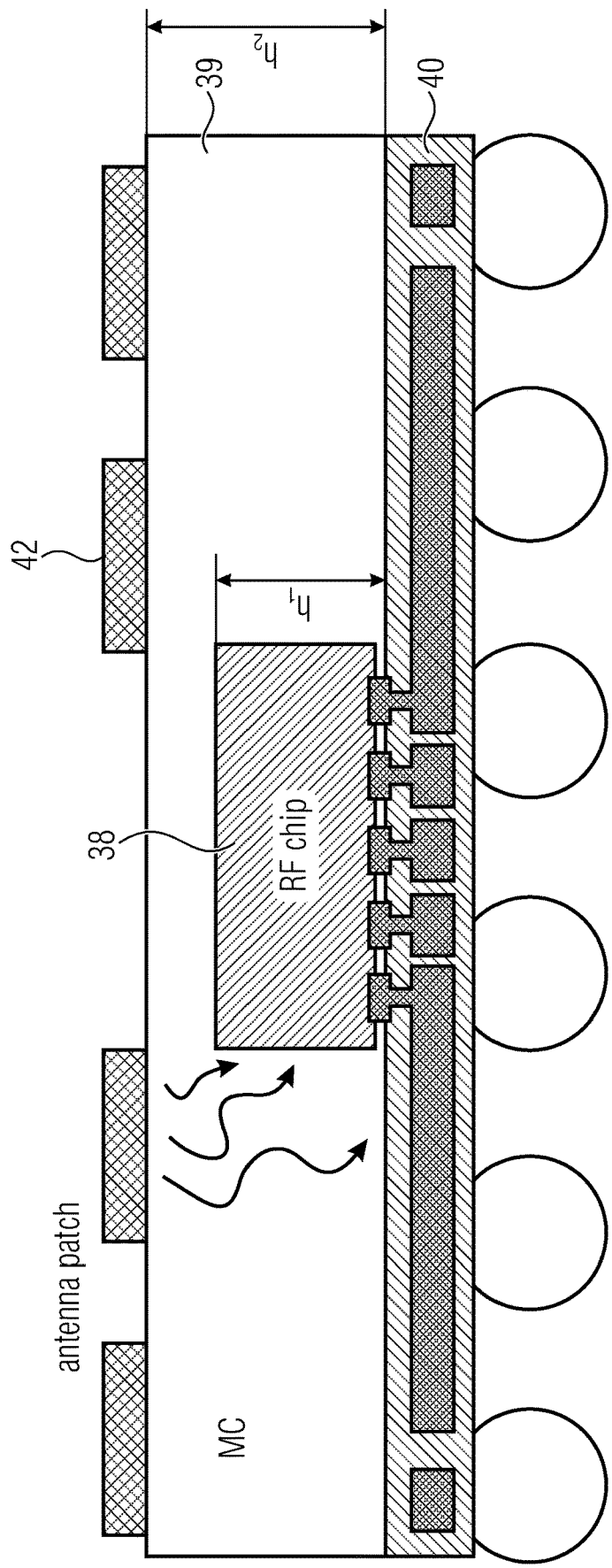

FIG. 2c shows a further modification starting from the wafer level package 10', namely the wafer level package 10''. In the same, compared to the wafer level package 10', the contacting plane 18 (now 18') is implemented in a modified manner. The modification is selected such that in the area of the chip 12a, instead of the contacts for connecting to the bottom side, contacting means for heat dissipation, here a cooling body 18k', are provided in order to dissipate heat from the chip 12a. The cooling body 18k' spreads the heat into the environment below the chip 12a and the solder balls 18f transfer the heat into the next package level, i.e., the system board.

According to the embodiments, a thermally conductive material can be provided between chip and cooling body 18k'. Here, it should be noted that, according to further embodiments, heat dissipation would also be possible via the above discussed solder balls 18s, wherein then usually also a thermally conductive material is used.

From a manufacturing point of view, there are different options how the surface of the chip 12a is exposed. According to a first variation, the chip rear side can be exposed directly in the mold process. Alternatively, subsequent grinding away would also be possible. The metallization typically necessitated in the cooling body 18k' can either be provided in the chip 12a already prior to packaging or can be deposited, e.g., via a thin film wiring layer or a sputtering layer with galvanic reinforcement.

Even when the above embodiments have been discussed in the context of the apparatus, a further embodiment provides a respective manufacturing method. Here, in a first basic step, the chip substrate 12' is provided together with the contacting plane 18 and 18', respectively, as well as the optional redistribution plane 20'. The layer 20' and also after depositing the layer 20', the antenna substrate 14'+16 is deposited. This antenna layer 14'+16 can then be deposited, e.g., via laminating (RF substrate), layer by layer in thin film technology and by planar adhesion (glass). Here, the antenna layer 14a' can either be structured already prior to assembly or can also be structured sequentially after assembly. In other words, this means that the chip substrate 12' with the redistribution plane 20' is connected to the antenna substrate 14'+16. This connection is performed on wafer level.

FIG. 2e shows the wafer level package 10' of FIG. 2a with chip layer 12', antenna layer 14', shielding layer 16 as well as redistribution plane 20'. In this embodiment, the wafer level package 10' has an additional lens 21 (means for beam forming the electromagnetic wave emitted by the antenna) on the top side (main surface) adjacent to the antenna 14a'. This lens 21 serves for vertical focusing of the antenna beam.

FIG. 2f shows again the wafer level package 10' of FIG. 2a in combination with a housing 23 disposed on the top side (side of the antenna 14'). The housing 23 is made of glass or another non-shielding material. The housing 23 can, for example, be filled with air or a dielectric low-loss material. Further, the housing 23 can also contribute to beam forming/focusing of the electromagnetic wave. Both the housing 23 and the lens 21 can be applied together and in combination with all above-explained embodiments/wafer level package.

According to a further embodiment, a system is provided where the wafer level package is connected to (at least) one further (different or same) wafer level package. Connection is established, e.g., via the contacting layer. The further wafer level package can, for example, include also one or several antennas (array), such that a three-dimensional antenna structure is provided as a result.

All above-stated embodiments, in particular the embodiments of FIGS. 2a-2d, have in common that a short connecting path 16v' without many geometric discontinuities is enabled from the front end IC 12a to the antenna 14a', which results in good signal integrity, e.g., in the millimeter wave range or terahertz range. The platform and the module 10', 10" and 10'", respectively, allows the integration of antenna configurations with arbitrary attachment options. In particular with other FOWLP configurations, this is not the case. Further, here in particular illustrated in the context of FIGS. 2c and 2d, the above discussed structures allow an integrated solution for thermal management.

The fields of application are manifold. The platform 10, 10', 10", 10'" and the module, respectively, can be used to develop wireless communication systems that can be used in all frequency ranges of the electromagnetic spectrum, e.g., for WPAN, WLAN, mobile radio, satellites, etc.

The same can also be used to develop wireless sensor systems that can be used for any applications in all frequency ranges of the electromagnetic spectrum.

Further, the platform and the module 10-10'", respectively, can be used to develop radar systems which can be used for any applications in all frequency ranges of the electromagnetic spectrum.

As already mentioned above, the integrated antenna can be configured as antenna array or can include an antenna array, e.g., with a plurality of antennas (>5 or even >1000). Here, the several antennas are arranged beside one another such that no or only a minimum overlap with further elements, such as the chips, occurs.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] T. Meyer, G. Ofner, S. Bradt, M. Brunnbauer, R. Hagen; Embedded Wafer Level Ball Grid Array (eWLB); Proceedings of EPTC 2008, Singapore.
[2] B. Keser, C. Amrine, T. Duong, O. Fay, S. Hayes, G. Leal, W. Lytle, D. Mitchell, R. Wenzel; The Redistributed Chip Package: A Breakthrough for Advanced Packaging, Proceedings of ECTC 2007, Reno/Nevada, USA.
[3] Chung-Hao Tsai et Al., Array Antenna Integrated Fan-out Wafer Level Packaging (InFO-WLP) for Millimeter Wave System Applications", 2013 IEEE International Electronic Devices Meeting (IEDM), 9-11 Dec. 2013, pp. 25.1.1-25.1.4.
[4] Christopher Beck, et al., Industrial mmWave Radar Sensor in Embedded Wafer Level BGA Packaging Technology", IEEE SENSORS JOURNAL, VOL. 16, NO. 17, Sep. 1, 2016

The invention claimed is:

1. Wafer level package with integrated antenna, comprising:
   a contacting layer;
   an antenna layer with the integrated antenna; and
   a chip layer comprising at least one chip arranged between the contacting layer and the antenna layer,
   wherein a unit for shielding is implemented between the antenna layer and the chip layer,
   wherein a redistribution layer is configured between the unit for shielding and the chip layer; or wherein the integrated antenna is configured as an antenna array or comprises an antenna array; wherein the chip layer comprises a mold material that is arranged beside the at least one chip; or wherein the chip is contacted on the side of the antenna layer and/or wherein the chip comprises a temperature dissipator on a side opposite to the antenna layer; or wherein a further wafer level package is connected to the wafer level package via the contacting layer; or wherein a heat dissipator is provided in the contacting layer in the area of the chip.

2. Wafer level package according to claim 1, wherein the unit for shielding comprises a shield.

3. Wafer level package according to claim 1, wherein an isolation layer is implemented between the redistribution layer and the chip layer.

4. Wafer level package according to claim 1, wherein the chip is contacted on both sides.

5. Wafer level package according to claim 1, wherein the integrated antenna is connected to the chip by means of a via projecting through further layers,
   or wherein the integrated antenna is connected to the chip via electromagnetic coupling.

6. Wafer level package according to claim 1, wherein the antenna plane comprises a dielectric which is arranged between the integrated antenna and the unit for shielding.

7. Wafer level package according to claim 6, wherein the dielectric is perforated.

8. Wafer level package according to claim 1, wherein the integrated antenna comprises at least two antenna elements.

9. Wafer level package according to claim 1, wherein the chip layer comprises a plurality of chips.

10. Wafer level package according to claim 1, wherein the wafer level package comprises a lens that is configured to cooperate with the integrated antenna.

11. Method of manufacturing a wafer level package with integrated antenna, comprising:
    arranging a contacting layer;
    arranging a chip layer comprising at least one chip on the contacting layer;
    arranging a unit for shielding on the chip layer; and
    arranging an antenna layer on the unit for shielding,
    wherein a redistribution layer is configured between the unit for shielding and the chip layer; or wherein the integrated antenna is configured as an antenna array or comprises an antenna array; wherein the chip layer comprises a mold material that is arranged beside the at least one chip; or wherein the chip is contacted on the side of the antenna layer and/or wherein the chip comprises a temperature dissipator on a side opposite to the antenna layer; or wherein a further wafer level package is connected to the wafer level package via the contacting layer; or wherein a heat dissipator is provided in the contacting layer in the area of the chip.

12. Method according to claim 11, wherein the antenna layer is deposited by means of laminating and/or via planar adhesion and/or via a glass.

13. Wafer level package with integrated antenna, comprising:
    a contacting layer;
    an antenna layer with the integrated antenna; and
    a chip layer comprising at least one chip arranged between the contacting layer and the antenna layer, wherein a unit for shielding is implemented between the antenna layer and the chip layer, wherein the unit for shielding is formed by a shielding layer;

wherein a redistribution layer is implemented between the unit for shielding and the chip layer, wherein an isolation layer is implemented between the redistribution layer and the chip layer.

14. Method of manufacturing a wafer level package with integrated antenna, comprising:

arranging a contacting layer;

arranging a chip layer comprising at least one chip on the contacting layer;

arranging a unit for shielding on the chip layer; and arranging an antenna layer on the unit for shielding, wherein the unit for shielding is formed by a shielding layer;

wherein a redistribution layer is implemented between the unit for shielding and the chip layer.

* * * * *